United States Patent [19]

Sagara et al.

[11] Patent Number: 4,905,078
[45] Date of Patent: Feb. 27, 1990

[54] SEMICONDUCTOR DEVICE

[75] Inventors: Kazuhiko Sagara, Tokyo; Yoichi Tamaki, Kokubunji; Noriyuki Homma, Kodaira; Tohru Nakamura, Tanashi, all of Japan

[73] Assignee: Hitachi, Ltd., Tokyo, Japan

[21] Appl. No.: 84,074

[22] Filed: Aug. 11, 1987

[30] Foreign Application Priority Data

Sep. 24, 1986 [JP] Japan ................. 61-223525

[51] Int. Cl.⁴ ............................. H01L 29/72
[52] U.S. Cl. ........................... 357/34; 357/36; 357/51; 357/59
[58] Field of Search ............... 357/34, 36, 51, 59 AF, 357/59 HI, 71, 91, 86, 15; 365/154, 155, 179

[56] References Cited

U.S. PATENT DOCUMENTS

| | | | |
|---|---|---|---|
| 3,749,987 | 7/1973 | Anantha | 357/59 A |
| 4,322,821 | 3/1982 | Lohstroh et al. | 357/59 A |
| 4,338,138 | 7/1982 | Cavaliere et al. | 357/59 H |
| 4,538,244 | 8/1985 | Suao et al. | 365/154 |
| 4,584,594 | 4/1986 | Vora et al. | 357/86 |
| 4,609,407 | 9/1986 | Masao et al. | 357/91 |
| 4,636,833 | 1/1987 | Nishioka et al. | 357/71 |
| 4,654,824 | 3/1987 | Thomas et al. | 365/154 |

FOREIGN PATENT DOCUMENTS

| | | | |
|---|---|---|---|
| 58-218098 | 12/1983 | Japan | 357/34 |
| 59-139678 | 8/1984 | Japan | 357/34 |
| 59-151390 | 8/1984 | Japan | 355/155 |
| 61-104655 | 5/1986 | Japan | 357/34 |

Primary Examiner—Andrew J. James
Assistant Examiner—Sara W. Crane
Attorney, Agent, or Firm—Antonelli, Terry & Wands

[57] ABSTRACT

A semiconductor device includes a semiconductor layer provided above a pair of bipolar transistors formed in a surface region of a semiconductor body. Schottky barrier diodes and resistors are formed in the semiconductor layer. The pair of bipolar transistors, the Schottky barrier diodes and the resistors are electrically connected to constitute a bipolar memory. Since the Schottky barrier diodes and the resistors can be formed above the bipolar transistors, an area required for the memory cell can be made greatly small and the occurrence of an hindrance caused by α particles is minimal.

29 Claims, 4 Drawing Sheets

SEMICONDUCTOR DEVICE

BACKGROUND OF THE INVENTION

The present invention relates to a semiconductor device, and more specifically to a bipolar memory which has a high α-particle immunity and which is to be fabricated with a high integration density.

In the conventional bipolar memory as disclosed by JP-A-61-104655, all of Schottky barrier diodes SBD1 and SBD2, high resistive polycrystalline silicon layer, high resistive impurity-doped layer, and transistors TR1 and TR2 are arranged in a plane to form a flip-flop type of static bipolar memory cell circuit as shown in FIG. 2. However, the plane-like arrangement of constituent elements of the memory has a problem that an area required for the memory cell cannot be made small, thereby rendering high integration difficult.

U.S. Pat. No. 4,636,833 has proposed a bipolar memory in which the required area is reduced by superimposing an MOS capacitor on a Schottky barrier diode. In order to further improve the integration density of the bipolar memory, it is desired to further reduce the required area.

A semiconductor memory is subjected to an hindrance in that an erroneous storage may result from the presence of external α particles. This hindrance is generally called a soft error. Since the soft error increases as the integration density of the memory becomes higher, the prevention of the soft error is a very important problem for a semiconductor memory having a high integration density.

SUMMARY OF THE INVENTION

An object of the present invention is to solve the above-mentioned problems in the prior art and to provide a bipolar memory which has a high α-particle immunity and fabricated with a very high integration density.

To that end, a polycrystalline or monocrystalline semiconductor layer is formed on a semiconductor body and the semiconductor layer is used for forming a Schottky barrier diode and a resistor. The Schottky barrier diode and the resistor are formed above a bipolar transistor formed in the semiconductor body, thereby simultaneously realizing the reduction of an area required for the memory and the prevention of a soft error caused by α particles.

DESCRIPTION OF THE PREFERRED EMBODIMENTS

A memory cell area can be remarkably reduced by providing a stacked structure in which a semiconductor layer is formed on an emitter (or collector) of a bipolar transistor, and a Schottky diode and other semiconductor elements are formed in the semiconductor layer. Since the bipolar transistor can be operated in a reverse direction, a variation in a collector potential due to external noises is small. Since the collector can be disposed on the outermost surface side of a semiconductor body, the α-particle immunity can be remarkably improved.

The semiconductor layer may be made of polycrystalline silicon or monocrystalline silicon. The monocrystalline silicon layer can be formed by forming a film of amorphous silicon on the emitter (or collector) and mono-crystallizing the amorphous silicon film by means of a solid-phase epitaxial technique. The polycrystalline silicon layer can be formed by any well-known technique.

An embodiment of the present invention will now be explained by use of FIGS. 1 and 3 to 8.

Figure 3:
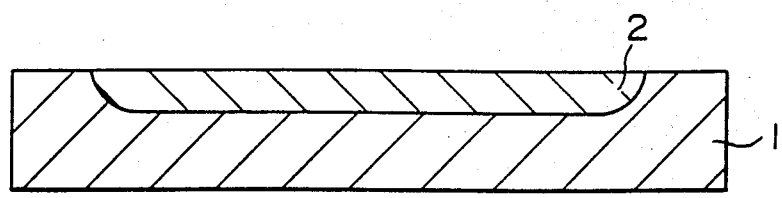
FIGS. 3 to 8 are cross sections for explaining steps of a process of fabricating the semiconductor device having the structure shown in FIG. 1.
Figure 4:
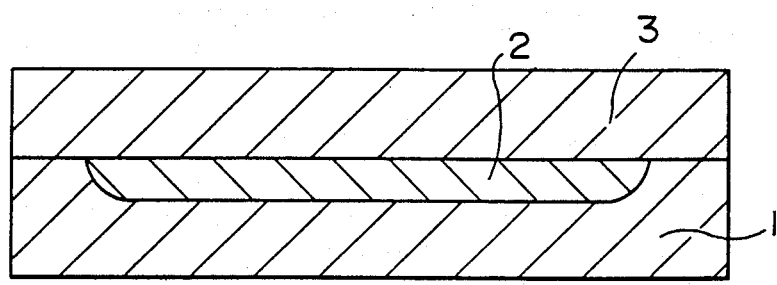
Figure 5:
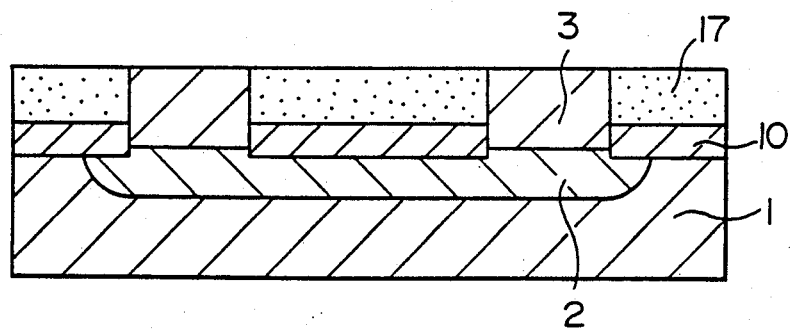
Figure 6:
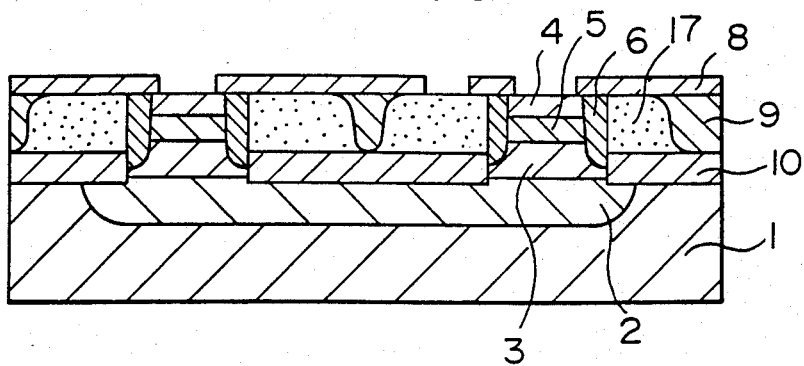

Referring to FIG. 3, a desired portion of a p-type silicon substrate or body 1 is doped with an impurity by a well-known thermal diffusion or ion-implantation technique to provide an n$^+$-type buried layer 2. Thereafter, an n$^-$-type epitaxial layer 3 is grown by means of a well-known vapor-phase epitaxial technique (see FIG. 4). Next, as shown in FIG. 5, unnecessary portions of the n$^-$ epitaxial layer 3 are removed by use of a conventional photo-etching process to form a raised region of the monocrystalline n$^-$ epitaxial layer 3, and a silicon dioxide layer 10 and a polycrystalline silicon layer 17 are provided on the both sides of the raised region. As shown in FIG. 6, a part of the polycrystalline silicon layer 17 is oxidized to provide a silicon dioxide layer 9, and thereafter a p-type layer 5, a p$^+$-type layer 6 serving as a graft base, and an n$^+$-type layer 4 are formed in the above-mentioned raised region to provide an emitter 4, a base 5 and a collector 3. An insulating film 8 (made of, for example, SiO$_2$) is formed on the surface of the semiconductor body. Openings are provided in portions of the insulating film 8 which correspond to at least the n$^+$-type layer 4.

Figure 7:
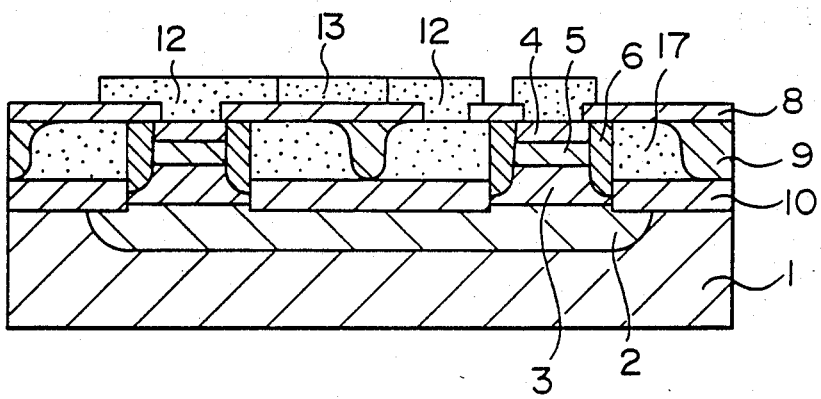

Then, a polycrystalline silicon layer is deposited on the surface of the semiconductor body, and desired portions of the polycrystalline silicon layer are doped with impurities by means of an ion-implantation technique, thereby providing an n-type polycrystalline silicon region 12 and an n$^-$-type polycrystalline silicon region 13 as shown in FIG. 7. In place of the polycrystalline silicon layer, an amorphous silicon layer may be deposited on the surface of the semiconductor body. In that case, it is possible to monocrystallize the amorphous silicon layer by carrying out a heat treatment, at temperatures not higher than 800° C., where a solid-phase epitaxial growth takes place starting from an interface between the amorphous silicon layer and the underlying monocrystalline silicon layer. The characteristics of a Schottky barrier diode or the like formed in the monocrystalline silicon layer are superior to those formed in the polycrystalline silicon layer in that a leakage current is small.

Figure 1:
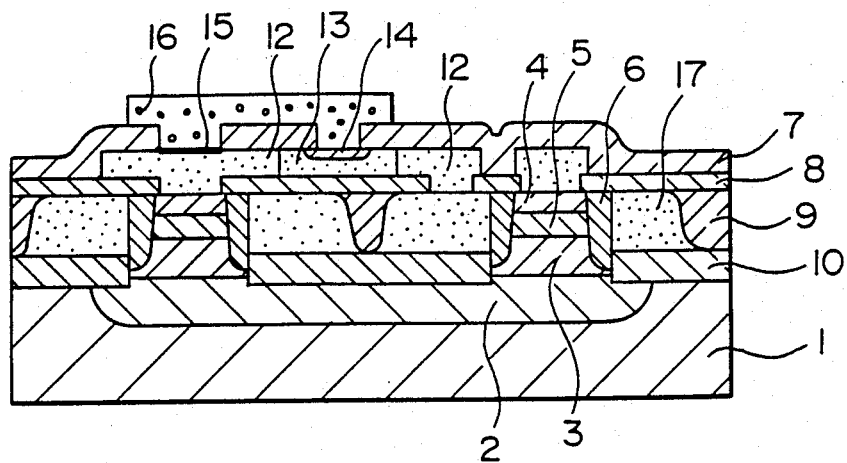
FIG. 1 is a cross section of a main part of a semiconductor device according to an embodiment of the present invention.
Figure 2:
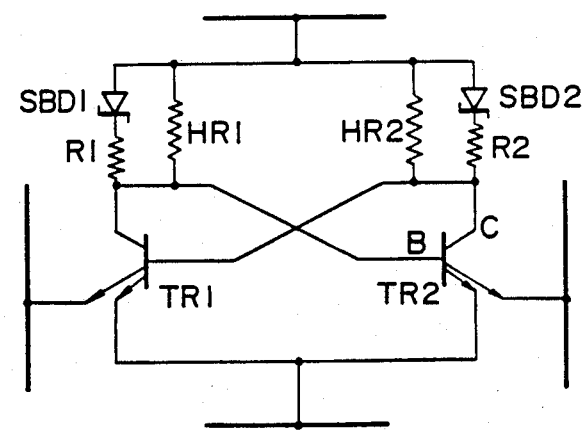
FIG. 2 is a circuit diagram of the semiconductor device shown in FIG. 1.
Figure 8:
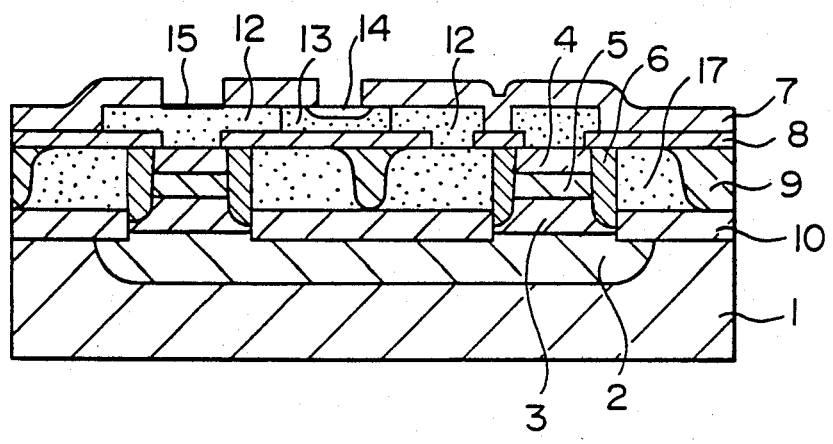

Next, a silicon dioxide layer 7 is disposed on the surface of the semiconductor device and openings are provided in predetermined portions of the silicon dioxide layer 7 (see FIG. 8). Then, n+-type layer 14 and a silicide layer 15 are formed through impurity diffusion and ion-implantation via the openings and the subsequent heat treatment. Without forming the silicide layer 15, a metal electrode may be deposited directly on the n-type polycrystalline silicon layer 12 to form a Schottky barrier junction, thereby obtaining a desired diode characteristic. Thereafter, an electrode or wiring layer 16 of Al is formed to complete a semiconductor device having a structure shown in FIG. 1. In FIG. 1, a Schottky barrier diode SBD1 or SBD2 is formed by the silicide layer 15 and the n-type polycrystalline silicon region 12, a resistor HR1 or HR2 having a high value resistance is formed by the n+-type layer 14 and the n−-type polycrystalline silicon region 13, a transistor TR1 or TR2 is formed by the n+-type layer 4, the p-type layer 5 and the n−-type layer 3. The Schottky barrier diodes SBD1 and SBD2, the high-value resistors HR1 and HR2, and the transistor TR1 and TR2 are interconnected by the Al wiring layer 16, the n-type polycrystalline silicon layer 12, etc. to provide a bipolar memory shown in FIG. 2. A resistor R1 or R2 shown in FIG. 2 has a value determined by the sheet resistance of the n-type polycrystalline silicon region 12 beneath the Schottky diode.

Figure 9:
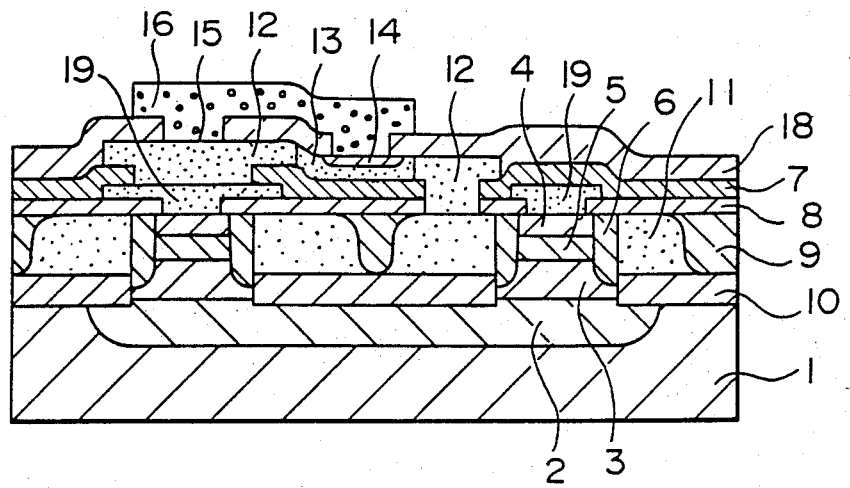
FIG. 9 is a cross section of a semiconductor device according to another embodiment of the present invention.

FIG. 9 shows another embodiment of the present invention. In this embodiment, the n+-type layer 4 of the transistor is formed by thermal diffusion using an n+-type polycrystalline silicon layer 19 as a diffusion source. For that purpose, an additional silicon dioxide layer 7' is provided. Reference numeral 18 designates a silicon dioxide layer similar to the silicon dioxide layer 7 of FIG. 1.

Figure 10:
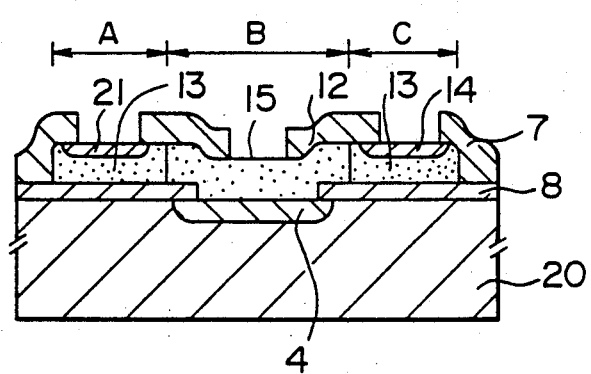
FIGS. 10 and 11 are a cross section and a circuit diagram for explaining a further embodiment of the present invention.
Figure 11:
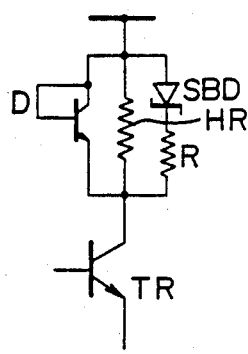

According to a further embodiment of the present invention, a clamp diode D as shown in FIG. 11 can be added to a part of the circuit by providing three regions A, B and C in the polycrystalline silicon layer as shown in FIG. 10. The region A including a p-type layer 21 and the n−-type polycrystalline silicon layer 13 is used for providing the clamp diode D, the region B including the silicide layer 15 and the n-type polycrystalline silicon layer 12 is used for providing a Schottky barrier diode SBD and a resistor R, and the region C including the n+-type layer 14 and the n−-type polycrystalline silicon layer 13 is used for providing a high-value resistor HR. In FIG. 10, reference numeral 7' designates a silicon dioxide layer, and numeral 20 generally designates the semiconductor body which has the same structure as that shown in FIG. 1 or 9 inclusive of the transistor TR (only the n+-type region 4 of which is shown in FIG. 10).

According to the present invention, since the Schottky barrier diode, the clamp diode, the high-value resistor and the low-value resistor can be all formed just above the transistor, as shown by the embodiments of FIGS. 1, 9 and 10, an area required for the bipolar memory cell can be greatly reduced.

The present invention is not limited to the disclosed embodiments. For example, all the conductivity types of the shown regions or layers can be inverted.

According to the present invention hereinabove explained using the embodiments, it is possible to reduce the memory cell area of a bipolar memory to 200 $\mu m^2$ which is about two-fifths of the conventional memory cell area (500 $\mu m^2$). As a result, a high integration not smaller than 64Kbits bipolar SRAM is possible. Also, the α-particle immunity of the memory cell according to the present invention can be improved by two or more orders in comparison with that of the conventional memory cell so that the occurrence of a soft error is remarkably reduced. Further, a delay time due to the wiring can be remarkably decreased owing to the available high integration. For example, there can be realized a 64Kb bipolar memory having an address access time not slower than 1 nano-second which is about one-fifth of the conventional bipolar memory.

In the foregoing embodiments, a vertical bipolar transistor is used in which the graft base 6 having a high impurity concentration is provided on the side of the intrinsic base 5 and the polycrystalline silicon layer 17 having a low resistivity is used as a drawing electrode. Though the use of such a type of transistor is most preferable in the present invention, a different type of vertical bipolar transistor can be used in the present invention. For example, a vertical bipolar transistor can be used in which a semiconductor layer is connected to an upper marginal or end portion of the transistor, as is shown in FIGS. 6(c) and 7 of JP-A-59-139678. It is also possible to use a well-known lateral bipolar transistor. In the lateral bipolar transistor, however, since a collector is formed at a relatively deep portion of a semiconductor body, the improvement of the immunity against α particles cannot be expected, though the reduction in an area required is possible by virtue of the present invention.

We claim:

1. A semiconductor device comprising:

first and second vertical bipolar transistors respectively formed in first and second isolated protruding epitaxial layer segments which segments are formed on an upper surface of a semiconductor substrate, each epitaxial layer segment including a first region of a first conductivity type, a second region of a second conductivity type and a third region of said first conductivity type, wherein said first, second and third regions are stacked in descending order from an upper surface of said epitaxial layer, and wherein an upper surface of said first region is in the same plane as the upper surface of said epitaxial layer segments;

an insulating film formed above the upper surface of said semiconductor substrate and having openings wherein the first regions of said first and second epitaxial layer segments are disposed;

a first semiconductor layer, having at least first and second adjacent regions respectively having different impurity concentrations and being of the same conductivity type as the first region of said first and second epitaxial layer segments which form said transistors, said first semiconductor layer being formed above said insulting film and being in electrical contact, via the first region thereof, with the first region of said first epitaxial layer segment through one of said openings of said insulating film and wherein the second region of said first semiconductor layer is in electrical contact on one side thereof with the first region of said semiconductor layer, which first region overlies said first epitaxial portion, and is in electrical contact on another side thereof, through a further opening of said insulating film, with the second region of said second epitaxial layer segment;

a Schottky barrier diode located above the first region of said first epitaxial layer segment, having a junction formed on the first region at an upper surface region of said first semiconductor layer, said first region of said first semiconductor layer being a low resistive region connecting said Schottky barrier diode to the first region of said first epitaxial layer segment; and wherein the second region of said first semiconductor layer is of a relatively lower impurity concentration doped region than said first region thereof and has a highly concentrated impurity doped region formed thereon.

2. A semiconductor device according to claim 1, wherein the first region of said first epitaxial layer segment is an emitter of said first vertical bipolar transistor and the second region of said second epitaxial layer segment is a base of said second vertical bipolar transistor.

3. A semiconductor device according to claim 1, wherein the first a region of said first epitaxial layer segment is a collector of said first vertical bipolar transistor and the second region of said second epitaxial layer segment is a base of said second vertical bipolar transistor.

4. A semiconductor device according to claim 1, wherein said Schottky barrier diode is located directly above the first region of said first epitaxial layer portion and comprises a Schottky barrier formed between the first region of said first semiconductor layer and a silicide layer formed in a surface region of said first semiconductor layer.

5. A semiconductor device according to claim 4, wherein said highly concentrated impurity doped region is a low resistive third region which is provided on an upper surface of the second region formed in said first semiconductor layer, said low resistive third region having the same conductivity type as said high resistive region.

6. A semiconductor device according to claim 5, wherein said silicide layer and said low resistive third region are electrically interconnected with each other by a wiring layer.

7. A semiconductor device according to claim 1, wherein the first region of said first semiconductor layer is comprised of first and second sections thereof, said first section being formed above said first epitaxial layer portion contacting said second region of said first semiconductor layer at said one side thereof and said first region of said first epitaxial layer segment and said second section being formed on said further opening of said insulating film and being extended over said insulating film so as to effect contact with said second region of said first semiconductor layer, and wherein said low resistive first region formed in said first semiconductor layer is electrically connected with the second region of said second epitaxial layer segment through a second semiconductor layer formed in a region between said first and second epitaxial segments which region is below the second section of said low resistive first region.

8. A semiconductor device according to claim 1, wherein the third regions of said first and second epitaxial layer segments are electrically interconnected with each other through a low resistive buried layer of said first conductivity type provided on said semiconductor body.

9. A semiconductor device according to claim 8, wherein the third regions of said first and second epitaxial layer segments are individual collectors of said first and second vertical bipolar transistors.

10. A semiconductor device according to claim 8, where the third regions of said first and second epitaxial layer segments are individual emitters of said first and second vertical bipolar transistors.

11. A semiconductor device according to claim 5, wherein said first semiconductor layer is one of a monocrystalline silicon layer and a polycrystalline silicon layer having said at least first and second regions, each of a different impurity concentration.

12. A semiconductor device according to claim 7, wherein said first semiconductor layer is a polycrystalline silicon layer having said at least first and second regions, each of a different impurity concentration, and said second semiconductor layer is a low resistive polycrystalline silicon layer providing contact between the first region of said first polycrystalline silicon layer and the second region of said second transistor.

13. A semiconductor device according to claim 1, wherein said first semiconductor layer is one of a monocrystalline silicon layer and a polycrystalline silicon layer having said at least first and second regions, each of a different impurity concentration.

14. A semiconductor device comprising:
at least first and second vertical bipolar transistors, formed on a main surface of a semiconductor substrate, wherein each vertical bipolar transistor includes a first region of a first conductivity type overlying a second region of a second conductivity type, complementary to said first conductivity type, and said second region overlying a third region of said first conductivity type;
a first insulating film formed on said main surface of said semiconductor substrate and having openings wherein said vertical bipolar transistors are disposed;
a first polycrystalline semiconductor layer formed on said first insulating film and between said first and second vertical bipolar transistors, having an upper surface, and being in electrical contact with said second region of each vertical transistor, said first polycrystalline semiconductor layer being divided by an isolation region into segments so as to electrically isolate the second regions of said first and second vertical bipolar transistors from each other;
a second insulating film formed above the upper surfaces of said first and second vertical bipolar transistors, on said first polycrystalline semiconductor layer and on an upper surface of said isolation region and having openings over the first regions of said vertical bipolar transistors and over one of said segments of said first polycrystalline semiconductor layer which is in electrical contact with the second region of said second vertical bipolar transistor;
a second polycrystalline semiconductor layer of said first conductivity type, having at least first and second regions of different impurity doping concentrations, formed on the upper surface of the first region of said first vertical bipolar transistor through an opening of said second insulating film and extending over said second insulating film overlying said upper surfaces between said transistors and being in contact with said one segment of the upper surface of said first polycrystalline silicon film through an opening of said second insulating film so as to effect electrical contact between the first region of said first transistor with the second region of said second transistor;
a Schottky barrier diode having a junction formed at an upper surface of said first region of said second polycrystalline semiconductor layer directly above the first region of said first vertical bipolar transistor, said Schottky barrier diode being electrically connected, via said first region of said second polycrystalline semiconductor layer, to said first region of said transistor, said first region of said second polycrystalline semiconductor layer providing a low resistive connection between said Schottky barrier diode and the first region of said first transistor;

wherein the second region of said second polycrystalline semiconductor layer is of a lower impurity doping concentration than said first region thereof thereby providing high resistance; and wherein said second region of said second polycrystalline semiconductor layer is electrically connected to the first region of said second polycrystalline semiconductor layer and the second region of said second vertical bipolar transistor, via said one segment of said first polycrystalline semiconductor layer.

15. A semiconductor device according to claim 14, wherein said second region of said second polycrystalline semiconductor layer is disposed on the upper surface of said second insulating film corresponding to an area above said semiconductor substrate between said first and second transistors.

16. A semiconductor device according to claim 15, wherein said first, second and third regions of said transistors are emitter, base and collector regions, respectively.

17. A semiconductor device according to claim 15, wherein said first, second and third regions of said transistors are collector, base and emitter regions, respectively.

18. A semiconductor device according to claim 14, further comprising:
a third insulating film formed on upper surfaces of said second insulating film and on said second polycrystalline semiconductor layer and including a plurality of openings so as to effect in electrical contact surfaces with a wiring layer.

19. A semiconductor device according to claim 18, wherein said wiring layer is a metal electrode layer which commonly contacts, through respective openings of said third insulating film, the upper surface of said first region of said second polycrystalline semiconductor which forms said Schottky barrier diode junction and an upper surface of said high resistive second region of said second polycrystalline semiconductor layer via a highly doped contact region, corresponding to a third highly doped region of said second polycrystalline semiconductor layer.

20. A semiconductor device according to claim 19, wherein said Schottky barrier diode includes a silicide layer at an opening of said third insulating film on the upper surface of said first portion of said second polycrystalline semiconductor layer.

21. A semiconductor device according to claim 19, wherein said metal electrode layer consists of aluminum.

22. A semiconductor device according to claim 21, wherein said first and second vertical bipolar transistors further include graft base regions for electrically contacting the respective second regions thereof, which are the base regions of the transistors, to the corresponding segments of the first polycrystalline semiconductor layer.

23. A semiconductor device according to claim 22, wherein said first, second and third regions of said transistors are formed in individual epitaxial layer segments.

24. A semiconductor device according to claim 23, wherein said first and second polycrystalline semiconductor layers are polycrystalline silicon layers.

25. A semiconductor device according to claim 24, wherein said second polycrystalline silicon layer is an n-type layer, said first polycrystalline silicon layer is a low resistive layer and said first and second transistors are NPN type vertical bipolar transistors.

26. A semiconductor device according to claim 25, further including an n-type buried layer disposed beneath said transistors in said semiconductor substrate for electrically connecting said third regions thereof.

27. A semiconductor device according to claim 26, wherein said first, second and third regions of said transistors are emitter, base and collector regions, respectively.

28. A semiconductor device according to claim 26, wherein said first, second and third regions of said transistors are collector, base and emitter regions, respectively.

29. A semiconductor device according to claim 14, further including a buried layer of said first conductivity type disposed beneath said transistors in said semiconductor substrate for electrically connecting said third regions thereof.

* * * * *